United States Patent

Kropp et al.

Patent Number: 5,362,421
Date of Patent: Nov. 8, 1994

[54] ELECTRICALLY CONDUCTIVE ADHESIVE COMPOSITIONS

[75] Inventors: Michael A. Kropp, Cottage Grove; Wayne S. Mahoney, St. Paul, both of Minn.

[73] Assignee: Minnesota Mining and Manufacturing Company, St. Paul, Minn.

[21] Appl. No.: 78,740

[22] Filed: Jun. 16, 1993

[51] Int. Cl.$^5$ .......................... C08F 2/50; C07F 17/02
[52] U.S. Cl. .................... 252/512; 252/514; 556/47; 556/60; 556/142; 556/144; 525/56; 525/420; 525/403; 525/436; 525/437; 525/462; 525/535; 522/66; 522/126; 522/146; 428/355; 428/352
[58] Field of Search ................. 556/47, 60, 142, 144; 525/56, 403, 420, 436, 437, 462, 535; 428/355, 352; 252/512, 514; 522/66, 126, 146

[56] References Cited

U.S. PATENT DOCUMENTS

| | | | |
|---|---|---|---|
| 4,970,624 | 11/1990 | Arneson et al. | 361/398 |
| 5,065,505 | 11/1991 | Matsubara et al. | 29/830 |
| 5,245,750 | 9/1993 | Crumly et al. | 29/840 |

*Primary Examiner*—Daniel R. Zirker
*Attorney, Agent, or Firm*—Gary L. Griswold; Walter N. Kirn; Carolyn V. Peters

[57] ABSTRACT

An anisotropically conductive adhesive composition provides electrical conductivity between facing electrodes but maintains electric insulation laterally between adjacent electrodes and comprises (a) a cationically polymerizable monomer, such as a glycidyl epoxy resin; (b) a thermoplastic resin, essentially free of nucleophilic or metal complexing functional groups; (c) optionally, an alcohol containing material; (d) a thermally initiated catalyst system comprising: (1) a salt of an organometallic cation; (2) a cure rate enhancer; and (3) a stabilizing additive; (e) conductive particles; and (f) optionally, a silane coupling agent, wherein the adhesive compositions cure at a temperature of 120°-125° C.

11 Claims, No Drawings

ELECTRICALLY CONDUCTIVE ADHESIVE COMPOSITIONS

TECHNICAL FIELD

This invention relates to an adhesive composition and more particularly to an anisotropically conductive adhesive composition useful for connecting flexible printed circuits to flat panel displays.

BACKGROUND OF THE INVENTION

An adhesive that has the ability to establish multiple discrete electrical connections, often in extremely close proximity, between two components is commonly referred to as an "anisotropically conductive adhesive" or as a "z-axis adhesive." A typical use for this type of material is to provide connection between a flexible printed circuit and a flat panel display.

Several performance and handling characteristics are required of a z-axis adhesive. With regard to performance, the ability to establish and maintain high integrity electrical connections is the most critical need. Generally, this means that the adhesive should possess moderately high elastic modulus and good creep resistance, even at elevated temperatures and humidities. In addition, good adhesion to both substrates being connected is essential not only to provide good working strength during product assembly but also to prevent delaminations during exposure to extreme environments which can lead to total failure of the connections.

With regard to handling characteristics, the severity of the bonding process as defined by required bonding time, adhesive temperature and bond pressure is the most important. In general, the processing temperature must exceed the highest temperature for which good interconnection integrity is required. However, in the interest of avoiding the potential for damage to either the substrates or any adjacent components it is desirable to develop materials which can minimize the gap between maximum test temperature and processing temperature. This concern becomes particularly important in applications calling for the use of flexible printed circuits using base films other than polyimide. For a growing number of applications, substrates are being developed which can't tolerate bonding temperatures higher than 120°–130° C. Despite this constraint, reliability testing needs cannot be relaxed. Therefore there is a need for materials that can be bonded at temperatures only slightly higher than the maximum test temperature.

Some of the first z-axis adhesives to be developed utilized simple, non-reactive hot-melt type compositions such as styrene-butadiene-styrene block copolymers. These materials offered such conveniences as indefinite shelf life, rapid processing and easy reworkability. However, a considerable drawback to these materials was their somewhat poor resistance to elevated temperature and humidity aging. The required bonding temperature of 150° C. for these materials was sufficiently modest for some but not all applications, and the interconnection stability for most applications was marginal at 125° C.

As the applications of z-axis adhesives evolved the need for reliability increased. Hence it became necessary to develop cross-linkable adhesive compositions in order to provide improved heat resistance. The challenge became to provide curable compositions that didn't compromise the convenient handling features of the hot-melt materials. An example of this type of second generation material was described in JP1-113479, which taught an epoxy-based composition which utilizes an epoxy modified imidazole accelerator and a thermoplastic component. This type of formulation was claimed to exhibit up to 6 months shelf-life at room temperature, but required a bonding temperature of at least 170° C. Another similar example of this type of material was described in U.S. Pat. No. 5,001,542, which described the use of a microencapsulated accelerator. Once again, a modified imidazole requiring bonding temperature of at least 170° C. was used as the accelerator. Both of the above examples rely on the accelerator to catalyze an epoxy—epoxy homopolymerization. Cyanate ester based compositions were described in U.S. Pat. No. 5,143,785 for the same type of material, but these materials also require cure at greater than 170° C.

SUMMARY OF THE INVENTION

One aspect of the present invention provides an anisotropically conductive adhesive composition prepared from a formulation comprising:

(a) at least one cationically curable epoxy monomer;
(b) at least one thermoplastic oligomeric or polymeric resin essentially free of nucleophilic groups, such as amine, amide, nitrile, sulfur, or phosphorus functional groups or metal-complexing groups, such as carboxylic acid, sulfonic acid;
(c) optionally, an alcohol-containing material;
(d) a multi-component thermal initiator comprising:
  (1) at least one salt of an organometallic cation, wherein the organometallic cation is selected from a class of substituted and unsubstituted aromatic compounds based on a benzene or cyclopentadienyl nucleus, the metal atom is a transition metal atom and the anion is tetrafluoroborate, hexafluorophosphate, hexafluoroarsenate, hydroxypentafluoroantimonate, trifluoromethanesulfonate, or hexafluoroantimonate;
  (2) at least one stabilizing additive; and
  (3) at least one cure rate enhancer;
(e) a plurality of conductive particles;
(f) optionally, at least one silane coupling agent; and
(g) optionally, additional adjuvants.

In another aspect, a process is provided for making an anisotropically conductive adhesive interconnection comprising the steps of:

(a) providing a thermally cationically curable adhesive composition as described above, and
(b) adding sufficient heat to cationically cure the composition.

In yet another aspect, an article is provided comprising a substrate having on at least one surface thereof a layer of the anisotropically conductive adhesive composition of the invention. The article can be provided by a method comprising the steps:

(a) providing a substrate;
(b) coating at least one surface of the substrate with a cationically polymerizable composition of at least one epoxy monomer, optional adjuvants and a multi-component thermal initiator system comprising a salt of an organometallic complex cation, a stabilizing additive and a cure rate enhancer; and
(c) supplying sufficient heat to cure the composition.

Advantageously, the anisotropically conductive adhesive composition of the present invention provides electrical conductivity between facing electrodes or circuit traces but maintains electrical insulation laterally between adjacent electrodes or circuit traces.

Advantageously, the adhesive cure chemistry of the present invention offers significant reduction in processing temperatures with virtually no compromise in shelf stability and environmental contact stability relative to art known conductive adhesives. The adhesives of this invention can be formulated to be flexible dry films having either no-tack or low-tack, and can be provided on a discardable carrier film, such as a release liner. The conductive adhesives can be applied in essentially the same manner as the other known z-axis adhesives described in the art with the exception the anisotropically conductive adhesives of the present invention are curable at a temperature of 120°–125° C. rather than 170°–180° C.

As used in this application:

"catalytically-effective amount" means a quantity sufficient to effect polymerization of the curable composition to a polymerized product at least to a degree to cause an increase in viscosity of the composition under the conditions specified;

"group" and "monomer" and "ligand" means a chemical species that allows for substitution or which may be substituted by conventional substituents that do not interfere with the desired product, e.g., substituents can be alkyl, alkoxy, aryl, phenyl, halo (F, Cl, Br, I), etc;

"initiation system" or "multi-component initiator" means at least one salt of an organometallic complex cation, at least one stabilizing additive and at least one cure rate enhancer, the system being capable of initiating cationic polymerization;

"organometallic salt" means an ionic salt of an organometallic complex cation, wherein the cation contains at least one carbon atom of an organic group that is bonded to a metal atom of the transition metal series (F. A. Cotton, G. Wilkinson *Basic Inorganic Chemistry*, Wiley, 1976, p 497);

"polymerizable composition" as useful herein means a mixture of the initiation system and the cationically curable monomer;

"polymerize or cure" means to supply sufficient energy to a composition to alter the physical state of the composition, to make it transform from a fluid to less fluid state, to go from a tacky or non-tacky state, to go from a soluble to insoluble state, or to decrease the amount of cationically polymerizable material by its consumption in a reaction; and "stabilizing additive" means at least one of specified classes of compounds that moderate the cure of a composition of the invention.

DESCRIPTION OF THE PREFERRED EMBODIMENT(S)

The anisotropically conductive adhesive compositions of the present invention offer significant reduction in processing temperature with virtually no compromise in shelf stability and environmental contact stability relative to the other well known anisotropically conductive adhesives. The conductive adhesives of this invention can be formulated to be flexible dry films having either no-tack or low-tack, and can be provided on a discardable carrier film. They can be applied in essentially the same manner as art known z-axis adhesives described above with the exception that they are curable at a temperature of 120°–125° C. rather than 170°–180° C.

The anisotropically conductive adhesive is prepared from a curable composition comprising: (a) a cationically polymerizable epoxy monomer; (b) a thermoplastic resin, essentially free of nucleophilic or metal complexing groups; (c) optionally, an alcohol-continuing material; (d) a multi-component thermal initiator system comprising: (1) an organometallic cation complex catalyst; (2) a cure rate enhancer; and (3) a stabilizing additive; (e) a plurality of conductive particles; and (f) optionally, a silane coupling agent.

The cationically polymerizable monomers that are useful are epoxy resins. Preferably, the epoxy resins are 'electronic grade', that is, low in ionic contaminants. The epoxy resins can include propylene oxide, epichlorohydrin, styrene oxide, glycidol, the Quatrex ™ series type of epoxy resins available from Dow Chemical Co., including the diglycidyl ether of bisphenol A and chain extended versions of this material such as Quatrex 1010, Quatrex 1410, or the Aratronic ™ series (available from Ciba Geigy) including the diglycidyl ether of bisphenol F such as Aratronic 5040 and Aratronic 5046, or their equivalent from other manufacturers, dicyclopentadiene dioxide, epoxidized polybutadiene like the Poly bd ™ resins from Elf Atochem, 1,4-butanediol diglycidyl ether, polyglycidyl ether of phenolformaldehyde resole or novolac (Quatrex ™ 2010) resin, and resorcinol diglycidyl ether. Also useful are the cycloaliphatic epoxies, such as cyclohexene oxide and the ERL ™ series type of resins available from Union Carbide, such as vinylcyclohexene oxide, vinylcyclohexene dioxide, 3,4-epoxycyclohexylmethyl-3,4-epoxycyclohexanecarboxylate, bis-(3,4-epoxycyclohexyl) adipate and 2-(3,4-epoxycyclohexyl-5,5-spiro3,4-epoxy) cyclohexene-m-dioxane. The preferred epoxy resins are the glycidyl ether type of resins. It is also within the scope of this invention to use a blend of more than one epoxy resin in preparing the adhesive compositions.

The thermoplastic oligomeric or polymeric resins useful in the anisotropically conductive adhesive compositions are film formers and in some cases permit rework of a bond using an appropriate solvent. The thermoplastic resins include those that preferably have glass transition temperatures and/or melting points <120° C. Useful thermoplastic resins are essentially free of groups that would interfere with the cationic polymerization of the epoxy functional monomers. More particularly, useful thermoplastic resins are essentially free of nucleophilic groups, such as amine, amide, nitrile, sulfur or phosphorus functional groups, or metal complexing groups, such as carboxylic acid, sulfonic acid groups. Furthermore, suitable thermoplastic resins are soluble in solvents such as THF or MEK and exhibit an initial compatibility with the epoxy resin used. This compatibility allows the blend of epoxy resin and thermoplastic resin to be solvent cast without phase separating. Nonlimiting examples of thermoplastic resins having these characteristics and useful in this invention include polyesters, co-polyesters, acrylic and methacrylic resins, phenoxy resins, and novolac resins. It is also within the scope of this invention to use a blend of more than one thermoplastic oligomeric or polymeric resin in preparing the adhesive compositions.

Additionally, it is also within the scope of this invention to utilize thermoplastic resins containing a nucleus or segment that would function as stabilizing additives and/or cure rate enhancers as described below. However, it is preferred to provide unassociated stabilizing additives and/or cure rate enhancers in the preparation of the electrically conductive adhesives of the present invention.

Although addition of an alcohol-containing material is optional, in many instances this addition is unnecessary. When the thermoplastic resin contains a high degree of alcohol functionality, such as with phenoxy and novolac resins, it is preferable not to use any alcohol-containing materials. When used, the alcohol-containing material can aid in chain extensions and preventing over-crosslinking of the epoxy during curing.

When present, useful alcohol-containing materials include aliphatic, cycloaliphatic, or alkanol-substituted arene mono-, or poly-alcohols having 2 to 18 carbon atoms and two to five, preferably two to four hydroxy groups or mixtures thereof. Useful mono-alcohols can include methanol, ethanol, 1-propanol, 2-propanol, 2-methyl-2-propanol, 1-butanol, 2-butanol, 1-pentanol, neopentyl alcohol, 3-pentanol, 1-hexanol, 1-heptanol, 1-octanol, 2-phenoxythanol, cyclopentanol, cyclohexanol, cyclohexylmethanol, 3-cyclohexyl-1-propanol, 2-norbornanemethanol, and tetrahydrofurfuryl alcohol.

The polyols useful in the present invention include aliphatic, cycloaliphatic, or alkanol-substituted arene polyols, or mixtures thereof having 2 to 18 carbon atoms and two to five, preferably at two to four hydroxy groups.

Examples of useful polyols include, but are not limited to, 1,2-ethanediol, 1,2-propanediol, 1,3-propanediol, 1,4-butanediol, 1,3-butanediol, 2-methyl-1,3-propanediol, 2,2-dimethyl-1,3-propanediol, and 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethylene glycol, triethylene glycol, tetraethylene glycol, glycerine, 2-ethyl-2-(hydroxymethyl)-1,3-propanediol, 2-ethyl-2-methyl-1,3-propanediol, pentaerythritol, 2-ethyl-1,3-pentanediol, and 2,2-oxydiethanol, 1,4-cyclohexane dimethanol, 1,4-benzene dimethanol, 2-butene-1,4-diol, and polyalkoxylated bisphenol A derivatives. Other examples of useful polyols are disclosed in U.S. Pat. No. 4,503,211.

Higher molecular weight polyols include the polyethylene and polypropylene oxide polymers in the molecular weight range of 200 to 20,000 such as the Carbowax ™ polyethyleneoxide materials supplied by Union Carbide, caprolactone polyols in the molecular weight range of 200 to 5,000, such as the Tone ™ polyol materials supplied by Union Carbide, polytetramethylene ether glycol in the molecular weight range of 200 to 4,000, such as the Terathane ™ materials supplied by Dupont, hydroxyl terminated polybutadiene resins such as the Poly bd ™ materials supplied by Elf Atochem, or equivalent materials supplied by other manufacturers.

The alcohol functional component can be present as a mixture of materials and can contain mono- and polyhydroxyl containing materials. The alcohol-containing material can be a blend of alcohol-containing materials. Preferably the alcohol-containing material is at least a diol and is present in an amount sufficient to provide an epoxy to hydroxy ratio in the composition between about 1:0.1 and 1:1, more preferably between about 1:0.2 and 1:0.8, and most preferably between about 1:0.3 and 1:0.6.

Although the silane coupling agent is optional, it is preferred that a silane coupling agent be added to the adhesive polymerizable composition when the substrate surface is glass, an oxide or any other surface that would benefit from the addition of a silane coupling agent. When present, a silane coupling agent contains a functional group that can react with the epoxy resin, for example, 3-glycidoxypropyltrimethoxysilane.

Conductive particles provide multiple discrete interconnections for each circuit trace. The conductive particles should be sized and loaded in accordance with the end use application. Factors, such as the width of circuit traces and distances between adjacent circuit traces can be used to determine the particle size and volume density. The conductive particles should be sufficiently small so as not to span the distance between adjacent circuit traces prohibiting adjacent traces from shorting out, and should be present in sufficient numbers so as to provide multiple discrete contact points at each trace location. Typically, the particle size diameters range from 4 to 30 micrometers ($\mu$m), preferably 10–15 $\mu$m with % by weights relative to the combined weight of the epoxy monomer and the thermoplastic resin of 1–30% by weight, preferably 1–10% by weight. For example, a particle population having diameters of 10–15 $\mu$m and loaded at approximately 1–10% by weight into the adhesive composition can provide interconnections for trace sizes as small as 100,000 $\mu$m$^2$ and positioned with as little as 50 $\mu$m separation between adjacent traces. Any of several particle types can be selected based on the end use application. Examples of useful particles include metallized plastic spheres, solid metal particles, precious metal-coated particles, solid particles and graphic powders. Factors such as metallurgy and the hardness of the substrate can be use to select the particle type for a given application.

Useful organometallic cation salts are selected from a class of substituted and unsubstituted aromatic compounds based on a benzene or cyclopentadienyl nucleus, the metal atoms is iron and the anion is tetrafluoroborate, hexafluorophosphate, hexafluoroarsenate, hydroxypentafluoroantimonate, trifluoromethanesulfonate, or hexafluoroantimonate. The salts of organometallic cations are known in the art and can be prepared as described in, for example, U.S. Pat. Nos. 5,089,536, 5,059,701, and 5,191,101 and such description is incorporated herein by reference. The salts of organometallic cations can be used as mixtures and isomeric mixtures. Disubstituted ferrocene derivatives can be prepared by the general procedure described in J. Amer. Chem. Soc., 1978, 100, 7264. Ferrocene derivatives can be oxidized to prepare the corresponding ferrocenium salts by the procedure described in Inorg. Chem., 1971, 10, 1559.

The salts of organometallic complex cations useful in the adhesive compositions of the present invention have the formula:

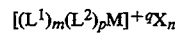

wherein:
M is selected from the group containing Cr, Mo, W, Mn, Re, Fe, Ru, and Os;
L$^1$ represents a ligand contributing $\pi$-electrons that can be selected from substituted and unsubstituted aromatic compounds and substituted and unsubstituted heterocyclic aromatic compounds, and capable of contributing six $\pi$-electrons to the valence shell of M;

$L^2$ represents a ligand contributing π-electrons that can be selected from substituted and unsubstituted cyclopentadienyl and indenyl anions, and capable of contributing six π-electrons to the valence shell of M;

m and p are integers having a value of 0 or 2, such that, when m is equal to 2, each $L^1$ may be the same or different ligands and p is equal to 0; and when p is equal to 2, each $L^2$ may be the same or different ligands and m is equal to 0, provided the sum of (m+p) is equal to 2.

q is an integer having a value of 1 or 2, the residual charge of the complex cation;

X is an anion selected from organic sulfonate anions selected from the group consisting of $CH_3SO_3^-$, $CF_3SO_3^-$, $C_6H_5SO_3^-$, p-toluenesulfonate, p-chlorobenzenesulfonate and related isomers, and halogen-containing complex anions of a metal or metalloid selected from the group consisting of $BF_4^-$, $AsF_6^-$, $PF_6^-$, $SbF_5OH^-$, $SbF_6^-$, and $CF_3SO_3^-$; and n is an integer having a value of 1 or 2, the number of complex anions required to neutralize the charge q on the complex cation.

Preferred examples of salts of organometallic complex cations include: bis-($\eta^6$-mesitylene)iron(2+) trifluoromethanesulfonate; bis-($\eta^5$-cyclopentadienyl)iron(1+) hexafluoroantimonate; and bis-($\eta^6$-mesitylene)iron(2+) hexafluoroantimonate, the more preferred salt being bis-($\eta^6$-mesitylene)iron(2+) hexafluoroantimonate.

Useful stabilizing additives includes compounds have segments or central nucleus as described in formulas 1 to 3. A first class of useful stabilizing additive comprise macrocyclic compounds and has formula (1)

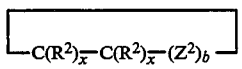

(1)

wherein $Z^2$ is divalent and can be —O—, —S—, or —NH—;

each $R^2$ independently can be hydrogen or $R^1$ which can be independently selected from $C_1$ to $C_{10}$ alkyl groups, or groups of one to four fused or unfused aromatic rings or a divalent radical selected from alkylene (3 to 10 carbon atoms) or phenylene moieties, and further two $R^2$s together can form a cyclic structure of 3 to 10 carbon atoms; and the carbon atoms can be interrupted with up to 10 individual, non-catenated heteroatoms selected from O, S, and N;

x can be 1 or 2; and b is an integer from 3 to 10.

The macrocyclic complexes containing oxygen according to Formula 1 are generally known as crown ethers (De Jong, F. et al. Adv. Org. Chem. 1980, 17, 279–433; Gokel, G. W. et al. Aldrichimica Acta, 1976, 9, 3–12.). In addition to oxygen, these macrocyclics may also contain any combination of nitrogen or sulfur atoms. Cryptands, which are bicyclic and cycles of higher order may also be used. Examples of suitable crown ethers and cryptands are 15-crown-5, 12-crown-4, 18-crown-6, 21 -crown-7, dibenzo-18-crown-6, dicyclohexyl-18-crown-6, benzo-15-crown-5, Kryptofix TM 21, Kryptofix TM 211, Kryptofix TM 222, Kryptofix TM 222B, (all available from the Aldrich Chemical Company). The preferred crown ether is 15-crown-5 (1,4,7,10,13-pentaoxacyclopentadecane).

Another class of stabilizing additives useful in the present invention can be represented by formulas (2) and (3):

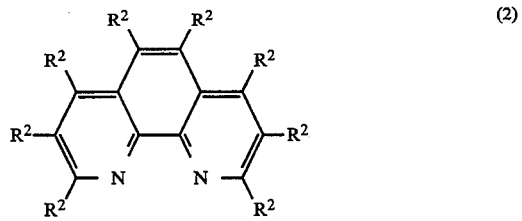

wherein $R^2$ is as defined above. Examples include substituted and unsubstituted phenanthroline compounds, the most common substituents being alkyl groups having 1 to 20 carbon atoms, the preferred phenanthroline being 1,10-phenanthroline; oxygen is not required when using this stabilizing additive, and

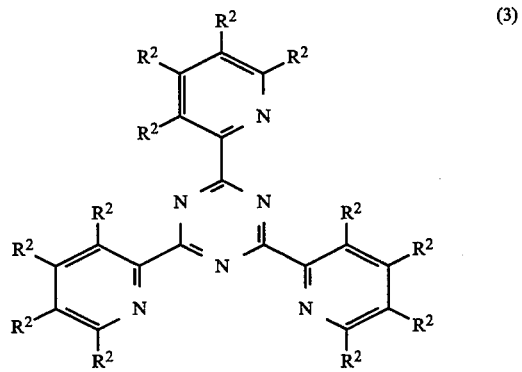

wherein $R^1$ may be independently selected and is as defined above. Examples of this stabilizing additive include substituted and unsubstituted tripyridyltriazine compounds, the preferred tripyridyltriazine being 2,4,6-tripyridyltriazine.

Examples of substituting groups that can be present on any $R^1$ group, all of which preferably have less than 30 carbon atoms and up to 10 heteroatoms selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosanyl, benzyl, allyl, benzylidene, ethenyl, and ethynyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, and cyclohexanecarbonyloxy; hydrocarbylcarbonamido, for example, acetamido, benzamido; azo; boryl; halo, for example, chloro, iodo, bromo, and fluoro; hydroxy; oxo; diphenylarsino; diphenylstibine; trimethylgermane; tributyltin; methylseleno; ethyltelluro; trimethylsiloxy; and aromatic groups such as cyclopentadienyl, phenyl, naphthyl and indenyl.

The rate of cure of the compositions of the invention can be altered by adding a cure rate enhancer such as acid-generating esters, which are described in U.S. Pat.

No. 3,907,706 and such description is incorporated herein by reference.

Preferred esters can be prepared by an esterification reaction between oxalic acid and tertiary alkyl alcohols such as t-butanol, 1,1-dimethylpropanol, 1-methyl-2-ethylpropanol, 1,1-dimethyl-n-butanol, 1,1-dimethyl-n-pentanol, 1,1-dimethylisobutanol, 1,1,2,2-tetramethylpropanol, 1-methylcyclopentanol, 1-methylcyclohexanol, 1,1-dimethyl-n-hexanol, 1,1-dimethyl-n-octanol, 1,1-diphenylethanol, and 1,1-dibenzyl ethanol.

In general, the multi-component thermal initiator system should be present in a catalytically effective amount to cationically cure the polymerizable epoxy monomers. Typically, the thermal initiator system can be present in the range of 0.01 to 20% by weight, preferably 0.1 to 5% by weight of the total polymerizable composition. The mole ratio of the organometallic complex salt to the stabilizing additive is generally in the range of 1:10 to 10:1, preferably 1:5 to 5:1. Typically, the cure rate enhancer, when present, is present in the range of 0.01 to 20 by weight, preferably 0.1 to 5% by weight of the total polymerizable composition.

Solvents, preferably organic, can be used to assist in dissolution of the initiator system in the epoxy monomers, and as a processing aid. It may be advantageous to prepare a concentrated solution of the organometallic complex salt in a small amount of solvent to simplify the preparation of the adhesive of the epoxy monomers to produce composition.

Adjuvants may optionally be added to the compositions such as colorants, stabilizers, light stabilizers, antioxidants, flow agents, bodying agents, flatting agents, inert fillers, binders, blowing agents, fungicides, bactericides, surfactants, plasticizers, rubber tougheners and other additives known to those skilled in the art. They can be also substantially unreactive, such as fillers both inorganic and organic. These adjuvants, if present are added in an amount effective for their art known purpose and are essentially free of nucleophilic or metal complexing groups.

The thermal initiator system will cationically polymerize the anisotropically conductive adhesive compositions of the invention. The level of catalytic activity depends on various factors such as the choice of ligands and counterions in the salt of an organometallic cation, the selection of the stabilizing additive and cure rate enhancer.

Furthermore, the amount of heat required for polymerization and the catalytically effective amount of the initiator system used will vary depending on the particular polymerizable composition used and the desired application of the polymerized product. Suitable sources of heat to cure the compositions of the invention include induction heating coils, hot bar bonders, ovens, hot plates, heat guns, IR sources including lasers, microwave sources, etc.

Typically, the adhesive composition will be coated onto a release liner and used as a transfer adhesive such that the adhesive can be adhered to a substrate and the liner removed. A typical use for the anisotropically conductive adhesives is to provide a connection between a flexible printed circuit and a flat panel display. Other potential applications include flipchip attachment of unpackaged silicon chips to various printed circuit substrates and interconnections between two flexible printed circuits or any combinations thereof. Suitable substrates useful to provide articles of the invention include, for example, metals (for example, aluminum, copper, cadmium, zinc, nickel, gold, platinum, silver), glass, various thermoplastic or thermoset films (for example, polyethylene terephthalate, plasticized polyvinyl chloride, polypropylene, polyethylene), ceramics, cellulosics, such as cellulose acetate, and epoxies (circuit boards).

Objects and advantages of this invention are further illustrated by the following examples, but the particular materials and amounts thereof recited in these examples, as well as other conditions and details, should not be construed to unduly limit this invention. All materials are commercially available or known to those skilled in the art unless otherwise stated or apparent.

| Glossary | |
|---|---|
| CHDM | 1,4-cyclohexanedimethanol |
| HDO | 1,6-hexanediol |
| GPMS | 3-glycidoxypropyltrimethoxysilane |
| THF | tetrahydrofuran |
| MEK | methyl ethyl ketone |
| Quatrex TM | epoxies commercially available from Dow Chemical, Co under the trade designation of Quatrex |
| Elvacite TM | acrylic thermoplastic resins commercially available from DuPont under the trade designation of Elvacite |
| Vitel TM | co-polyester resins commercially available from Shell Chemical Co. under the trade designation of Vitel |
| Whittaker TM | co-polyester resins commercially available from Whittaker Chemical Co. under the trade designation of Whittaker |
| $Mes_2Fe(SbF_6)_2$ | bis($\eta^6$-mesitylene)iron(2+) hexafluoroantimonate |

EXAMPLES 1-7

Preparation of Anisotropically Conductive Adhesives

All of the adhesive films were prepared as follows: the epoxy resin and thermoplastic resins were dissolved at between 25–50% solids in either THF or MEK solvent. The conductive particles (nickel particles commercially available as 37NR12-B2 from JCI) were then added to a slowly stirred solution of the resins. The particles were loaded 5% by weight based on the combined weights of the epoxy and thermoplastic resin and were nominally 12 μm in diameter.

Under yellow lights, the salt of an organometallic cation catalyst, stabilizer, alcohol-containing material, cure rate enhancer and silane coupling agent were predissolved in a minimum of solvent and added to the resin solution. The polymerizable solution was then stirred at high speed for five minutes. The solution was then coated onto polypropylene film using a knife coater, coating to a dry thickness of 1–2 mils. The coatings were allowed to air dry for 18–24 hours. The components and amounts of the Examples are summarized in Table 1.

Bonding of Substrates

The adhesive compositions were used to establish connections between flexible printed circuits and conductive glass slides. Flex circuits were polyimide-based laminates with Au-metallized 1 oz. Cu traces (commercially available from Minco Products and Century Circuits). Each flex-circuit sample contained 17 traces of 0.2 mm width on center to center spacing of 0.4 min. The glass test slides had a thin-film conductive coating of Indium-Tin Oxide (ITO) having sheet resistivity of 20 Ω/square (commercially available from Nippon Sheet Glass).

In bonding the adhesive, the adhesive was first pre-tacked to the flex circuit by placing the flex circuit on a hot plate at about 60° C., the adhesive (on a release liner) was gently pressed (rubbing by hand with a cotton tipped wooden applicator) for 2–5 seconds onto the flex circuit.

Adhesive bonds were made at 20 seconds using a Unitek Phasemaster IV hot-bar bonder using setpoints of 195° C. and 185° C. These setpoints were determined to provide a temperature of 125° C. to the adhesive. Bonding times were either 10 or 20 seconds using a pressure of 20–30 kg/cm$^2$. A solid blade type thermode (1.5 mm width) was used for all bond preparations.

Testing the Interconnections

The interconnections were characterized for both peel adhesion stability and interconnection resistance stability for flex circuits bonded to ITO coated glass slides. The 90° peel strength was determined on an Instron 1122 Tensile Tester (1000 N full scale) using a peel rate of 2.5 mm/min and a bond width of approximately 20 mm using a 20 kN load cell. The recorded value is the peak value. The Peel Strength results are summarized in Tables 3 and 4.

Interconnect electrical resistance was measured using a four-wire method using the principles described in ASTM B 539-90 such that the net resistance not due to the interconnection was minimized to approximately 150 mΩ (milliohms). Measurements were made in three different environments, initially and aged for 1 week. The Interconnection Resistance Stability results are summarized in Tables 5–11.

Testing of Latency

Latency was gauged both by thermal analysis of the adhesive and by assessing handling as a function of shelf age at ~22° C. Thermal analysis was performed using differential scanning calorimetry (DSC). Mettler TA3000 DSC instrument was used for DSC analysis. DSC was used to measure the exothermic heat of reaction associated with the cure of the epoxy material. This energy is measured in Joule/gram (J/g). The exotherm profile, i.e. peak temperature, onset temperature, etc., of the exotherm provided information on conditions that are needed to cure the material. The onset temperature ($T_{onset}$) is the point of intersection between the tangents drawn to the curve along the baseline, and after the onset of the exotherm at the point of maximum change in slope. The integrated energy under an exothermic peak is related to the extent of cure. The Tg was measured from the third scan. The inflection point was then recorded. Key parameters included onset of cure and peak exotherm temperature. Generally, cure profiles were sought for which peak exotherm was at 120° C. or less and for which cure onset was as close to the peak exotherm temperature as possible. The DSC results are summarized in Table 2.

Table 2 illustrates onset values of 100°–110° C. show the adhesive will be latent at room temperature. The sharp exotherm peak, that is, the peak is very close to the onset, and highly exothermic shows the adhesives cure rapidly at temperatures as low as 120° C. High Tg's are also obtainable.

Tables 3–4 illustrate satisfactory peel adhesion can be obtained for electrical applications.

Table 5–11 illustrate satisfactory initial interconnect resistances are obtained for all samples. Samples 6 and 7 show good interconnect stability under 60° C./95% r.h. conditions and satisfactory stability for thermal cycling at −55° to 125° C. Sample 3 shows excellent interconnect stability under all conditions, including the most severe 85° C./85% r.h. environment.

TABLE 1

| Components | 1 | 2 | 3 | 4 | 5 | 6 | 7 |
|---|---|---|---|---|---|---|---|
| Quatrex 1010 | — | — | 3.25 g | — | 3.25 g | 3.25 g | — |
| Quatrex 1410 | — | — | — | — | 3.25 g | 3.25 g | — |
| Quatrex 2010 | 6.5 g | 3.25 g | 3.25 g | 6.5 g | — | — | 6.5 g |
| Elvacite 2009 | 3.5 g | — | — | — | — | — | — |
| Elvacite 2041 | — | — | 3.5 g | — | — | — | — |
| Elvacite 2042 | — | 3.5 g | — | — | — | 3.5 g | — |
| Vitel 2190 | — | — | — | 3.5 g | 3.5 g | — | — |
| Whittaker 49000 | — | — | — | — | — | — | 3.5 g |
| Mes$_2$Fe(SbF$_6$)$_2$ | 67.5 mg | 65 mg | 65 mg | 68 mg | 65.3 mg | 68 mg | 65.3 mg |
| t-amyl oxalate | 69.8 mg | 65 mg | 71 mg | 69 mg | 68.8 mg | 71 mg | 69 mg |
| phenanthroline | 13.5 mg | 13 mg | 14 mg | 14 mg | 13 mg | 13 mg | 15 mg |
| CHDM | 48.4 mg | 50 mg | 49 mg | 49 mg | 250 mg | 255 mg | 488 mg |
| HDO | 48.4 mg | 50 mg | 49 mg | 49 mg | 250 mg | 255 mg | 488 mg |
| GPMS | 110 mg | 110 mg | 112 mg | 115 mg | 105 mg | 102 mg | 106 mg |
| Nickel | 0.5 g | 0.5 g | 0.5 g | 0.5 g | 0.5 g | 0.5 g | 0.5 g |

TABLE 2

Dynamic Scanning Calorimetry Data

| Sample | Onset (°C.) | Peak (°C.) | Exotherm (J/g) | Tg (°C.) | Tg (°C.) |
|---|---|---|---|---|---|
| 1 | 110.5 | 116 | 184.5 | 91.3 | 119.2 |
| 2 | 106.5 | 118.4 | 211.3 | 79.4 | — |
| 3 | 106.5 | 116.6 | 244.4 | 110.5 | — |
| 4 | 101.7 | 111.1 | 163.1 | 63.9 | 109.7 |
| 5 | 101.9 | 114.1 | 138.5 | 66.9 | 91.7 |
| 6 | 106.3 | 114.3 | 149.6 | 94.5 | — |
| 7 | 105.5 | 117.8 | 203.8 | 33.5 | — |

TABLE 3

| | Initial Values (g/cm$^2$) | | | |
|---|---|---|---|---|
| Sample | Peel 1 | Peel 2 | Peel 3 | Average |
| 1 | 175.4 | 200.8 | 195.2 | 185.3 |
| 2 | 225 | 155.2 | 159.3 | 192.2 |
| 3 | 213.3 | 152.9 | 128.3 | 170.8 |
| 4 | 314.7 | 284.9 | 389.3 | 352 |
| 5 | 781.5 | 947.4 | 909.7 | 845.6 |
| 6 | 371 | 460.6 | 335.9 | 353.5 |
| 7 | 1068.6 | 1090.8 | 916.6 | 992.6 |

TABLE 4

| Aged 1 Week at 60° C./95% Relative Humidity (g/cm$^2$) | | | | |
|---|---|---|---|---|
| Sample | Peel 1 | Peel 2 | Peel 3 | Average |
| 1 | 140 | 74.34 | — | 107.17 |
| 2 | 86.47 | 66.57 | 19.59 | 57.543 |

TABLE 4-continued

Aged 1 Week at 60° C./95% Relative Humidity (g/cm²)

| Sample | Peel 1 | Peel 2 | Peel 3 | Average |
|---|---|---|---|---|
| 3 | 87.92 | 148.5 | 138.2 | 124.87 |
| 4 | 217.55 | 224.92 | 311.5 | 251.31 |
| 5 | 212.02 | 188.69 | 244.2 | 214.96 |
| 6 | 117.82 | 119.47 | 129.3 | 122.2 |
| 7 | 306.47 | 370.8 | 333.6 | 336.95 |

TABLE 5

Interconnect Resistance for Adhesive Sample 1 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 1.195 | 15.136 | 3.339 | 2E + 15 | 0.953 | 2E + 15 |
| 0.928 | 13.985 | 1.302 | 2E + 15 | 1.004 | 2E + 15 |
| 0.776 | 12.49 | 1.021 | 2E + 15 | 1.401 | 2E + 15 |
| 0.817 | 7.999 | 0.696 | 0.001 | 1.021 | 0 |
| 0.753 | 16.312 | 0.725 | 7.282 | 1.402 | 20.137 |
| 0.890 | 7.884 | 0.748 | 2.843 | 0.970 | 12.108 |
| 0.741 | 11.058 | 0.638 | 2.321 | 1.049 | 16.886 |
| 1.187 | 7.097 | 0.921 | 5.144 | 1.201 | 20.235 |
| 0.734 | 9.260 | 0.823 | 1.684 | 1.390 | 14.673 |
| 0.840 | 6.009 | 0.768 | 1.568 | 2.063 | 21.06 |
| 0.761 | 11.475 | 0.735 | 1.635 | 1.065 | 15.941 |
| 1.004 | 10.318 | 0.581 | 1.196 | 1.572 | 12.852 |
| 0.947 | 9.265 | 0.620 | 1.327 | 1.102 | 12.616 |
| 0.971 | 15.142 | 0.732 | 2.567 | 1.449 | 16.173 |
| 1.038 | 13.152 | 0.822 | 3.860 | 1.124 | 10.27 |

TABLE 6

Interconnect Resistance for Adhesive Sample 2 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 0.108 | 9.741 | 12.643 | 2E + 15 | 0.794 | 1.84 |
| 1.065 | 3.919 | 3.709 | 0 | 0.905 | 1.887 |
| 0.876 | 5.886 | 1.280 | 3.488 | 0.686 | 1.751 |
| 1.267 | 2.782 | 1.298 | 5.028 | 0.981 | 2.105 |
| 0.128 | 4.519 | 1.768 | 2.013 | 0.816 | 1.694 |
| 0.085 | 2.618 | 1.236 | 1.647 | 0.656 | 1.252 |
| 0.086 | 3.841 | 1.098 | 2.173 | 0.940 | 1.827 |
| 0.272 | 4.426 | 1.481 | 2.957 | 1.181 | 2.425 |
| 1.655 | 4.633 | 1.859 | 2.474 | 0.995 | 2.006 |
| 1.360 | 8.207 | 1.661 | 2.771 | 0.965 | 2.164 |
| 0.122 | 6.218 | 1.572 | 4.272 | 0.806 | 1.414 |
| 0.105 | 3.747 | 1.690 | 2.059 | 0.818 | 1.814 |
| 1.335 | 3.967 | 1.616 | 4.395 | 1.428 | 3.646 |
| 1.133 | 8.510 | 1.668 | 5.408 | 0.901 | 2.321 |
| 1.061 | 3.751 | 4.056 | 4.840 | 0.960 | 3.055 |

TABLE 7

Interconnect Resistance for Adhesive Sample 3 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 0.473 | 1.034 | 0.352 | 0.540 | 0.521 | 1.301 |
| 0.413 | 0.969 | 0.354 | 0.659 | 0.433 | 1.489 |
| 0.472 | 1.083 | 0.434 | 0.796 | 0.413 | 1.212 |
| 0.427 | 0.776 | 0.437 | 1.275 | 0.432 | 1.178 |
| 0.339 | 0.649 | 0.376 | 1.688 | 0.328 | 0.613 |
| 0.530 | 1.155 | 0.340 | 0.685 | 0.413 | 0.84 |
| 0.585 | 1.087 | 0.392 | 0.438 | 0.450 | 0.788 |
| 0.411 | 0.870 | 0.452 | 0.514 | 0.375 | 0.681 |
| 0.385 | 0.853 | 0.521 | 0.972 | 0.352 | 0.72 |
| 0.480 | 0.958 | 0.675 | 0.912 | 0.309 | 0.456 |
| 0.453 | 0.859 | 0.610 | 0.914 | 0.325 | 0.472 |
| 0.582 | 1.265 | 0.691 | 0.888 | 0.386 | 0.665 |
| 0.508 | 0.920 | 0.630 | 1.254 | 0.494 | 1.107 |
| 0.556 | 1.029 | 0.669 | 0.840 | 0.504 | 0.906 |
| 0.681 | 1.034 | 0.433 | 0.745 | 0.575 | 0.951 |

TABLE 8

Interconnect Resistance for Adhesive Sample 4 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 0.782 | 5.189 | 2.789 | 2E + 15 | 0.111 | 3.557 |
| 1.171 | 10.93 | 1.313 | 0.026 | 3.130 | 6.779 |
| 1.193 | 12.862 | 1.284 | 48.588 | 2.582 | 16.102 |
| 0.608 | 2.875 | 1.171 | 7.189 | 3.141 | 20.129 |
| 0.407 | 3.286 | 0.781 | 11.774 | 2.612 | 19.05 |
| 0.603 | 5.575 | 1.540 | 36.865 | 2.032 | 8.125 |
| 1.216 | 9.744 | 1.144 | 14.861 | 1.047 | 2.018 |
| 0.849 | 9.939 | 1.007 | 6.151 | 1.374 | 3.639 |
| 0.557 | 1.779 | 1.442 | 9.587 | 2.677 | 7.946 |
| 0.393 | 2.409 | 0.930 | 27.427 | 2.560 | 9.142 |
| 0.596 | 6.852 | 1.128 | 11.722 | 3.130 | 9.279 |
| 0.626 | 6.263 | 1.086 | 10.974 | 1.765 | 5.224 |
| 0.970 | 4.987 | 1.192 | 9.714 | 2.223 | 9.542 |
| 0.576 | 6.694 | 1.745 | 6.636 | 6.692 | 12.526 |
| 0.514 | 4.652 | 1.729 | 19.795 | 3.185 | 13.563 |

TABLE 9

Interconnect Resistance for Adhesive Sample 5 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 1.261 | 2E + 15 | 2.524 | 2E + 15 | 1.154 | 2E + 15 |
| 1.475 | 0 | 2.372 | 2E + 15 | 1.734 | 2E + 15 |
| 1.117 | 41.571 | 1.538 | 2E + 15 | 1.400 | 2E + 15 |
| 2.193 | 18.016 | 1.986 | 2E + 15 | 0.575 | 2E + 15 |
| 1.255 | 2E + 15 | 2.157 | 2E + 15 | 1.337 | 2E + 15 |
| 1.507 | 2E + 15 | 1.604 | 2E + 15 | 1.723 | 2E + 15 |
| 2.106 | 0 | 1.440 | 2E + 15 | 1.372 | 2E + 15 |
| 2.197 | 14.48 | 1.661 | 0 | 1.077 | 2E + 15 |
| 2.757 | 53.481 | 2.072 | 4.090 | 1.208 | 2E + 15 |
| 1.744 | 0 | 1.212 | 3.181 | 1.338 | 2E + 15 |
| 3.660 | 33.742 | 1.296 | 3.792 | 1.725 | 2E + 15 |
| 3.109 | 43.607 | 2.463 | 20.873 | 1.812 | 2E + 15 |
| 1.507 | 17.721 | 5.373 | 35.864 | 1.753 | 2E + 15 |
| 3.013 | 2E + 15 | 2.419 | 2E + 15 | 1.884 | 2E + 15 |

TABLE 10

Interconnect Resistance for Adhesive Sample 6 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 0.736 | 6.509 | 0.871 | 1.205 | 0.652 | 2E + 15 |
| 0.694 | 3.189 | 0.513 | 0.896 | 0.627 | 0 |
| 0.517 | 1.884 | 0.494 | 1.259 | 0.725 | 28.728 |
| 0.753 | 3.135 | 0.528 | 0.693 | 0.863 | 11.896 |
| 0.542 | 1.789 | 0.669 | 1.136 | 0.804 | 12.94 |
| 0.631 | 3.674 | 0.635 | 0.983 | 0.681 | 14.428 |
| 0.659 | 3.035 | 0.636 | 1.002 | 0.632 | 13.905 |
| 0.646 | 2.671 | 0.691 | 1.297 | 0.776 | 11.929 |
| 0.592 | 3.307 | 0.710 | 0.984 | 0.805 | 10.135 |
| 0.663 | 2.383 | 0.752 | 1.110 | 0.805 | 11.389 |
| 0.719 | 4.647 | 0.722 | 1.132 | 1.007 | 16.972 |
| 0.687 | 2.639 | 0.802 | 1.218 | 1.138 | 19.001 |
| 0.814 | 4.090 | 0.753 | 1.343 | 0.803 | 9.287 |
| 0.599 | 2.421 | 0.650 | 1.039 | 0.833 | 8.783 |
| 0.862 | 3.813 | 0.714 | 1.370 | 0.907 | 4.36 |

TABLE 11

Interconnect Resistance for Adhesive Sample 7 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 0.606 | 2.214 | 0.541 | 0.944 | 1.159 | 6.63 |
| 0.446 | 5.600 | 0.514 | 0.706 | 1.374 | 10.743 |
| 0.460 | 9.715 | 0.496 | 0.729 | 1.934 | 26.219 |
| 0.316 | 2.275 | 0.423 | 0.556 | 1.935 | 16.804 |
| 0.378 | 2.729 | 0.596 | 1.026 | 0.953 | 13.136 |
| 0.506 | 4.218 | 0.526 | 0.934 | 2.211 | 9.799 |

TABLE 11-continued

Interconnect Resistance for Adhesive Sample 7 (Ω)

| −55° C./125° C. cycle | | 60° C./95% relative humidity | | 85° C./85% relative humidity | |
|---|---|---|---|---|---|
| Initial | 1 week | Initial | 1 week | Initial | 1 week |
| 0.501 | 1.449 | 0.529 | 1.049 | 2.241 | 26.899 |
| 0.395 | 1.116 | 0.413 | 0.581 | 2.256 | 13.756 |
| 0.323 | 1.167 | 0.388 | 0.575 | 1.085 | 3.739 |
| 0.316 | 1.663 | 0.405 | 0.605 | 1.132 | 1.984 |
| 0.343 | 1.680 | 0.427 | 0.561 | 1.370 | 4.985 |
| 0.515 | 3.736 | 0.480 | 0.686 | 1.022 | 10.18 |
| 0.430 | 1.593 | 0.416 | 0.624 | 0.697 | 13.893 |
| 0.489 | 2.493 | 0.405 | 0.574 | 1.017 | 2E + 15 |
| 0.438 | 4.707 | 0.488 | 0.732 | 1.590 | 2E + 15 |

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. An anisotropically conductive adhesive curable composition comprising:
   (a) at least one cationically curable epoxy resin;
   (b) at least one thermoplastic resin essentially free of nucleophilic or metal complexing functional groups;
   (c) a multi-component thermal initiator comprising:
      (1) at least one salt of an organometallic complex cation wherein the organometallic cation is selected from a class of substituted and unsubstituted aromatic compounds based on a benzene or cyclopentadienyl nucleus, and the anion is tetrafluoroborate, hexafluorophosphate, hexafluoroarsenate, hydroxypentafluoroantimonate, trifluoromethanesulfonate, or hexafluoroantimonate; and
      (2) at least one stabilizing additive;
      (3) at least one cure rate enhancer;
   (d) a plurality of conductive particles; and
   (e) optionally, at least one silane coupling agent;
wherein the composition are curable at a temperature of about 120°–125° C.

2. The anisotropically conductive adhesive composition according to claim 1 wherein the salt of an organometallic complex cation has the formula:

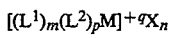

wherein:
   M is selected from the group containing Cr, Mo, W, Mn, Re, Fe, Ru, and Os;
   $L^1$ represents a ligand contributing p-electrons that can be selected from substituted and unsubstituted aromatic compounds and substituted or unsubstituted heterocyclic aromatic compounds, and capable of contributing six p-electrons to the valence shell of M;
   $L^2$ represents a ligand contributing p-electrons that can be selected from substituted or unsubstituted cyclopentadienyl and indenyl anions, and capable of contributing six p-electrons to the valence shell of M;
   m and p are integers having a value of 0 or 2, such that, when m is equal to 2, each $L^1$ may be the same or different ligands and p is equal to 0; and when p is equal to 2, each $L^2$ may be the same or different ligands and m is equal to 0, provided the sum of (m+p) is equal to 2;
   q is an integer having a value of 1 or 2, the residual charge of the complex cation;
   X is an anion selected from organic sulfonate anions selected from the group consisting of $CH_3SO_3^-$, $CF_3SO_3^-$, $C_6H_5SO_3^-$, p-toluenesulfonate, p-chlorobenzenesulfonate and related isomers, and halogen-containing complex anions of a metal or metalloid selected from the group consisting of $BF_4^-$, $AsF_6^-$, $PF_6^-$, $SbF_5OH^-$, $SbF_6^-$, and $CF_3SO_3^-$; and
   n is an integer having a value of 1 or 2, the number of complex anions required to neutralize the charge q on the complex cation.

3. The anisotropically conductive adhesive composition according to claim 2 wherein the salt of an organometallic complex cation is bis($\eta^6$-mesitylene)iron(2+) hexafluoroantimonate.

4. The anisotropically conductive adhesive composition according to claim 1 wherein the stabilizing additive has a segment or central nucleus and having a formula selected from the group consisting of:

(1)

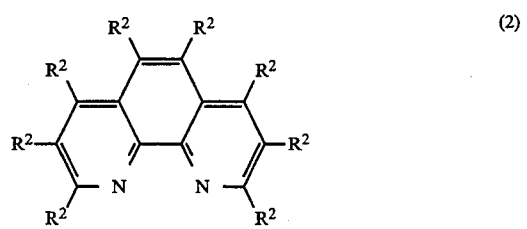

(2)

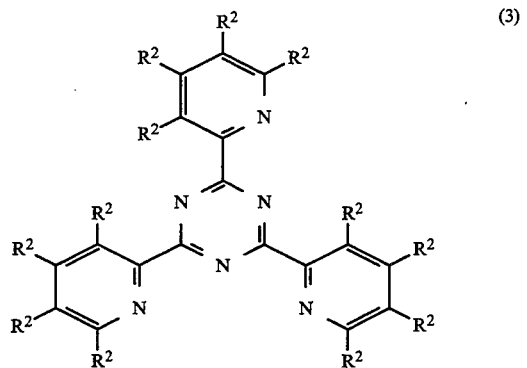

(3)

wherein
   $Z^2$ is divalent and can be —O—, —S—, or —NH—;
   each $R^2$ independently can be hydrogen or $R^1$ which can be independently selected from $C_1$ to $C_{10}$ alkyl groups, or groups of one to four fused or unfused aromatic rings or a divalent radical selected from alkylene (3 to 10 carbon atoms) or phenylene moieties, and further two $R^2$s together can form a cyclic structure of 3 to 10 carbon atoms; and the carbon atoms can be interrupted with up to 10 individual, non-catenated heteroatoms selected from O, S, and N;

x can be 1 or 2; and b is an integer from 3 to 10.

5. The anisotropically conductive adhesive composition according to claim 4 wherein the stabilizing additive is a substituted or unsubstituted phenanthroline compound, wherein the substituents are alkyl groups having 1 to 20 carbon atoms.

6. The anisotropically conductive adhesive composition according to claim 5 wherein the stabilizing additive is 1,10-phenanthroline.

7. The anisotropically conductive adhesive composition according to claim 1 wherein the cure rate enhancer is t-amyl oxalate or t-butyl oxalate.

8. The anisotropically conductive adhesive composition according to claim 1 further comprising at least one alcohol-containing material.

9. The anisotropically conductive adhesive composition according to claim 1 further comprising additional adjuvants.

10. A thermally cationically cured adhesive composition prepared according to the steps of:

(a) providing a thermally cationically curable adhesive composition comprising:

(1) at least one epoxy functional resin;

(2) at least one thermoplastic resin essentially free of nucleophilic or metal complexing functional groups;

(3) a multi-component thermal initiator comprising;

(i) at least one salt of an organometallic complex cation wherein the organometallic cation is selected from a class of substituted or unsubstituted aromatic compounds based on a benzene or cyclopentadienyl nucleus, and the anion is tetrafluoroborate, hexafluorophosphate, hexafluoroarsenate, hydroxypentafluoroantimonate, trifluoromethanesulfonate, or hexafluoroantimonate: and (ii) at least one stabilizing additive;

(iii) at least one cure rate enhancer;

(4) a plurality of conductive particle's; and (5) optionally, at least one silane coupling agent; and (b) adding sufficient heat at a temperature of about 120°–125° C. to cationically cure the composition.

11. The anisotropically conductive adhesive composition according to claim 1 wherein the multi-component thermal initiator is selected from the group consisting of (1) bis($\eta^6$-mesitylene)iron(2+) hexafluoroantimonate, (2) 1,10-phenanthroline; and (3) one of t-amyl oxalate or t-butyl oxalate.

* * * * *